May 5, 1970 M. GROZINGER 3,509,713

ELECTRONIC WATCH

Filed April 15, 1968 2 Sheets-Sheet 1

INVENTOR

MANFRED GROZINGER

BY Craig & Antonelli

ATTORNEYS

INVENTOR
MANFRED GROZINGER
BY Craig & Antonelli
ATTORNEYS

United States Patent Office 3,509,713

Patented May 5, 1970

3,509,713

ELECTRONIC WATCH

Manfred Grozinger, Schwenningen, Germany, assignor to Muller-Schlenker, Schwenningen, Germany Filed Apr. 15, 1968, Ser. No. 721,464
Claims priority, application Germany, Apr. 25, 1967, M 73,747
Int. Cl. G04c 3/00
U.S. Cl. 58—23 23 Claims

ABSTRACT OF THE DISCLOSURE

A watch with a purely electronic oscillator for generating periodic signals to drive the hands. The electronic oscillator is provided with at least one-frequency determining component which can be varied in size and which is coupled to a setting mechanism for correcting the setting of the hands so that its size is varied when the hands are adjusted. The coupling between the setting mechanism and the adjustable component of the electronic oscillator can be made effective only within a small angular portion of the range within which the setting mechanism can be adjusted.

Figure 1:
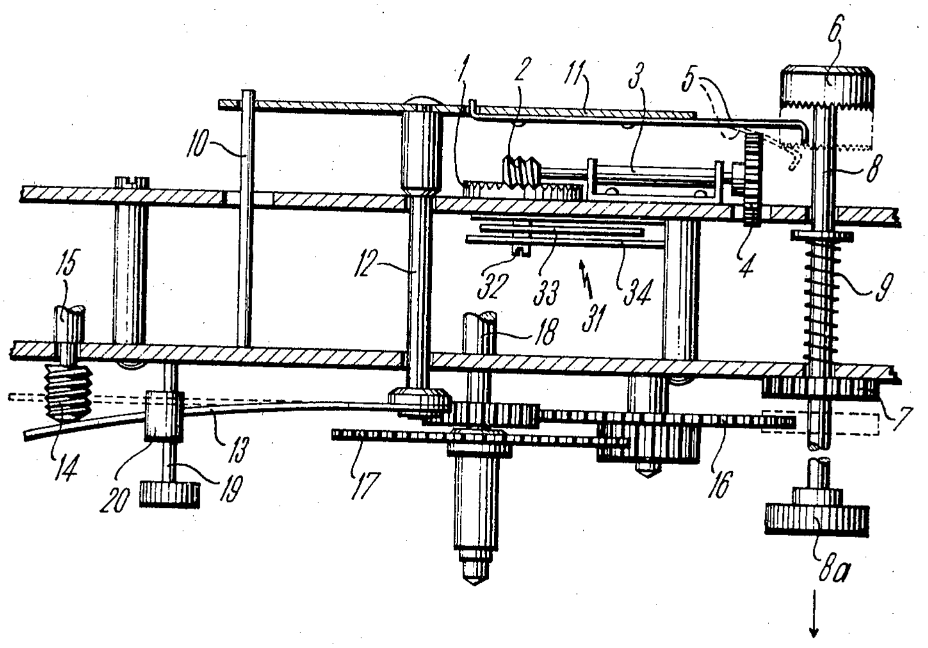

The present invention relates to a watch with a purely electronic oscillator for generating periodic signals to drive the hands.

Electronic timepieces incorporating a transistor oscillator with an LC oscillator as time-keeping element, the output signal of which is directly used to drive a synchronous motor, are known. Also known is the employment of a relaxation oscillator in the form of a multivibrator with two complementary transistors for generating switching pulses for the hand of a watch at a frequency of one pulse per minute.

These known systems with a purely electronic oscillator have the great advantage of a very simple mechanical construction. Their great disadvantage is that the long-time stability of the oscillator frequency does not come up to the standards required for timing devices. This accounts for the failure of such watches to find widespread acceptance. Attempts have been made to stabilize the frequency of the electronic oscillator with the aid of mechanical oscillators such as balances, tuning forks, vibrating reeds, piezoelectric crystals. Arranging such mechanical oscillators and coupling them with the electronic circuits naturally represents a considerable complication. These components not only require additional space but also involve considerable costs. This applies in particular where oscillating systems with temperature-compensating elements are used to avoid changes of the watch rate due to temperature fluctuations. Apart from this, the use of mechanical members largely cancels the advantages inherent in the employment of electronic circuits.

On the other hand, the employment of purely electronic circuits has been hitherto impeded by the above mentioned lack of long-time stability, which is mainly due to aging of the components of the electronic oscillator and the voltage variations which occur during the life of a battery. Short-term variations such as those caused by the daily march of temperature are less important, as these cancel each other in the daily average, whereas permanent changes in component data of the magnitude of a few tenths of one percent which occur in the course of time may lead to considerable inaccuracies. It should be remembered that in a watch an error of 0.1% means an inaccuracy of 1.44 minutes per day or approximately 10 minutes per week. An error of this order is too great to be acceptable for a timing device.

The accuracy of a watch must be greater by at least one power of ten.

It is the object of the present invention to provide a possibility of compensating the changes to which the components of an electronic oscillator are subject in the course of time without making use of expensive and space-consuming mechanical oscillators. According to the invention, this object is achieved by providing the electronic oscillator with at least one frequency-determining component which can be varied in size and which is coupled to a setting mechanism for correcting the setting of the hands so that its size is varied when the hands are adjusted, with the result that an adjustment of the hands causes the watch rate to be corrected so as to improve the accuracy in a manner known per se for watches with mechanical adjusting devices.

The application of the present invention enables changes in timing accuracy caused by slow permanent changes of the components and the drop in battery voltage to be easily compensated, since such changes occur continuously and in the same direction. An occasional adjustment of the watch corrects the frequency of the oscillator as required by the aging of the components. At extremely low cost, the invention thus provides a watch maintaining a very high degree of timing accuracy over a period of several years, because the frequency of oscillations is automatically set to the correct value by an occasional correction of the hand setting.

In a similar manner, the method of coupling the setting mechanism which serves to correct the hand setting with the regulator of the adjusting device has previously been applied to watches with mechanical adjusting device, but that measure was intended to provide for automatic adjustment of the watch. Such adjustment was, however, not achieved, since a watch with a mechanical adjusting device is mainly subject to short-term variations which are predominantly caused by the daily march of temperature, weather-dependent changes in humidity and pressure, and the like. Watches with a poor adjusting device, which strongly respond to such changes, cannot be made accurate by coupling the setting mechanism with the regulator of the adjusting device. At worst, these fluctuations are increased, because the rate changes resulting from the adjustment of the hand setting add too, and increase, the rate changes due to natural causes. On the other hand, such a correction of the watch rate is not required in well-balanced watches, since mechanical watches at worst are subjected to slight long-term rate changes such as caused by oil aging. For this reason, this method of correcting the watch rate has proved impractical for watches with mechanical adjusting devices.

It is, therefore, all the more surprising that in watches with a purely electronic oscillator generating periodic signals for rotating the hands an extremely good balancing of rate changes caused by aging of the components can be achieved by coupling the regulator drive with a frequency-determining component of the oscillator so that by applying the invention highly accurate watches can be manufactured which operate on purely electronic oscillators and which do not need any mechanical oscillators to stabilize the frequency of oscillations. Of course, the adjustable component of the oscillator may, for instance, be a potentiometer, a variable capacitor, or an inductance with adjustable iron core, including cores made of electric metal and ferrite, or with an adjustable coupling. Furthermore, it is also possible to vary the characteristics of several such components.

Coupling the setting mechanism which serves to correct the hand setting with a frequency-determining component of the circuit involves the risk of the nominal frequency being changed excessively during initial setting of the hands. For this reason, a further embodiment of the invention provides for the coupling between the setting mechanism and the adjustable component of the electronic oscillator to be effective only within a small angular portion of the range within which the setting mechanism can be adjusted. This ensures that the frequency correction is kept within narrow limits even if the hand setting is varied by a large amount. In addition, a locking device can be provided which becomes effective when the effective range of the coupling is exceeded during initial setting and which keeps the setting mechanism disengaged from the adjustable component for a predetermined length of time. This prevents the frequency of oscillations from being varied by every correction of the hand setting when the watch is adjusted several times at brief intervals, because the hand setting was not corrected with the necessary accuracy, for example. In watches equipped with a date-telling mechanism the drive of the locking device may be derived from the date-telling mechanism in a simple manner, thus obviating the need for expensive and space-consuming additional reduction gears for driving the locking device.

Furthermore, the setting mechanism and the adjustable component may be coupled with each other by means of a transmission with a variable transmission ratio, in particular by means of a cam. This measure enables the frequency correction to be matched to the frequency characteristic of the circuit arrangement employed in each particular case, although this matching may also be accomplished, without employing intermediate mechanical members, by means of a corresponding non-linear characteristic of the adjustable component, for example by a corresponding design of the winding of a potentiometer or the suitable cut of the plates of a variable capacitor.

The invention may be applied to watches having a separate setting mechanism as well as to watches which are set by shifting the minute hand. In the latter case the adjustment of the frequency-determining component may be derived from the minute shaft in a manner known per se.

Figure 2:
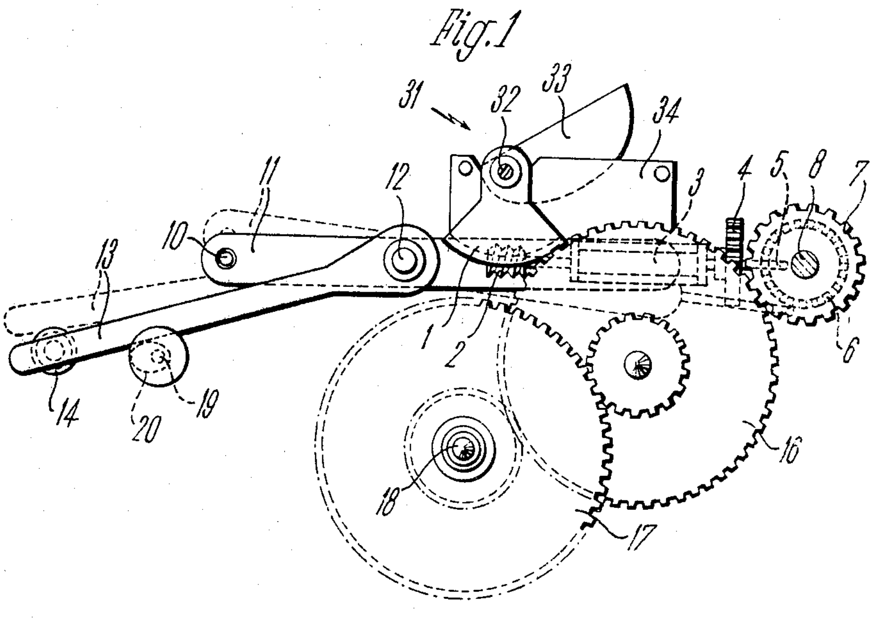
Figure 3:
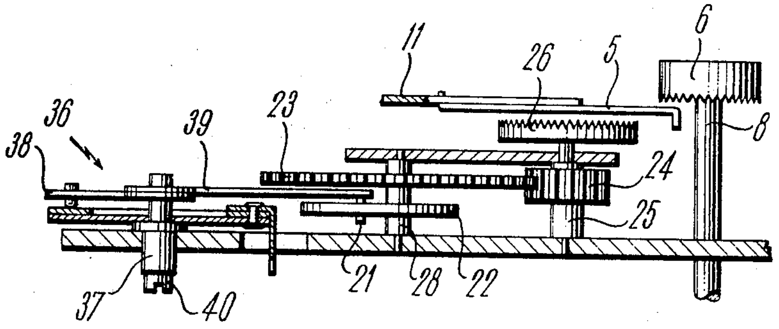
Figures 4, 5:
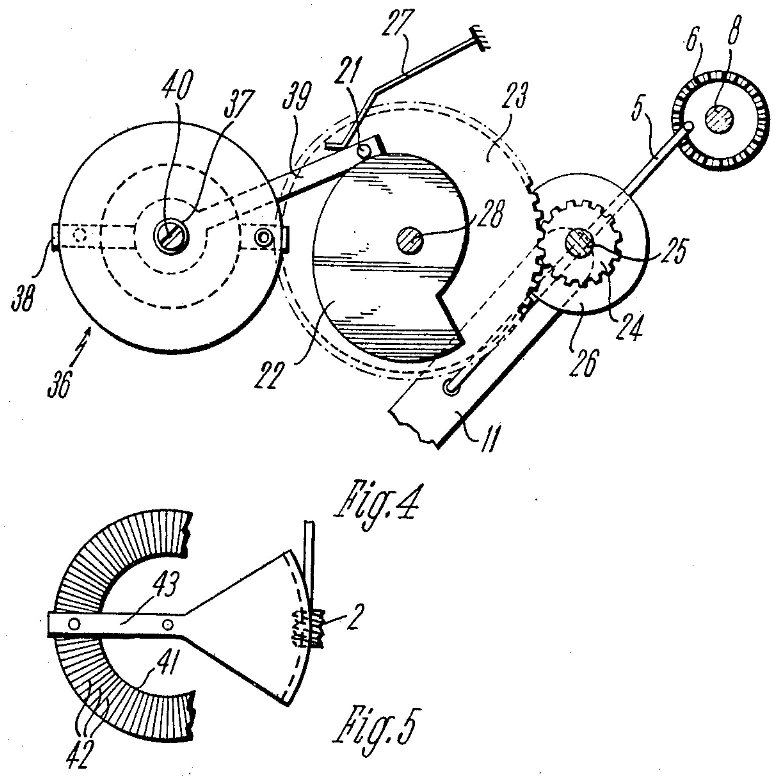

Further details and embodiments of the invention will become apparent from the following specification, in which the invention is described in greater detail, by referring to the embodiment shown in the accompanying drawing, in which FIG. 1 is a side elevation of a device for correcting the frequency of oscillations of a watch with a purely electronic oscillator, omitting all details which are of no importance for illustrating the invention, part of the illustration being shown as a sectional view, FIG. 2 is a top view of the arrangement according to FIG. 1, FIGS. 3 and 4 are a side elevation and a top view respectively, similar to FIGS. 1 and 2, of a further embodiment of the invention, and FIG. 5 is a top view of a modified form of the potentiometer of the arrangement according to FIG. 4.

The watch shown in FIGS. 1 and 2 includes a setting shaft 8 with a milled setting knob **8*a* and a setting pinion 7 at the end which projects from the front plate of the movement. As indicatd by the dash lines, the pinion 7 engages the gear 16 of the time indicator 17, 18 when the setting shaft is moved downward against the action of a spring 9 by pulling at the milled knob until the shaft 8** bottoms against a stop (not shown).

At its other end, which projects from the back plate of the movement, the setting shaft 8 is provided with a finely toothed crownwheel 6. When the setting shaft 8 is pulled, the crownwheel engages a thin rod-shaped spring 5 extending in an essentially radial direction with respect to the crown-wheel 6 and fastened to the end of a two-armed lever. The lever is mounted on a rotary shaft 12 extending in a parallel direction with respect to the setting shaft and, at the end facing away from the crownwheel 6, engages a flexible rod 10 which is secured to the front plate of the movement and, extending in a parallel direction with respect to the rotary shaft 12 of the lever 11, fits into a hole at the rear end of the lever. At the back of the back plate a shaft 3 is supported in a position essentially parallel to the rest position of the two-armed lever 11 and the rod-shaped spring 5 secured to the latter, the shaft 3 carrying a finely toothed spur gear 4 at the end facing the crownwheel 6 and a worm 2 at the opposite end. The worm 2 engages a toothed segment 1 mounted on the rotor shaft 32 of a variable capacitor 31, with the variable capacitor forming part of the oscillating circuit of a transistor oscillator (not shown) and the output signal of which is employed to drive and control the watch. The signal is supplied, for example, to a synchronous motor (not shown) which drives the shaft 18 of the time indicator. Alternatively, the capacitor 31 may be arranged in the feedback path of a multivibrator or some other pulse-generating relaxation oscillator. The output signals may then be fed to a stepping mechanism acting on the shaft 18 of the time indicator. In both cases the speed and, consequently, the watch rate is determined by the size of the capacitor 31, which determines the frequency of oscillations of the oscillator or the pulse repetition frequency of a relaxation oscillator. The accuracy of the watch can thus be adjusted by rotating the rotor 33 with respect to the stator 34.

In the watch according to the invention the capacitor 31 is adjusted not only during initial adjustment of the watch but also when the setting of the hands is corrected so as to compensate rate changes caused by aging of the components of the oscillator which occur in the course of time. This adjustment is accomplished by an arrangement whereby pulling the setting shaft 8 out of its position not only causes the setting pinion 7 to engage the gear 16 of the time indicator but also causes the crownwheel 6 at the other end of the setting shaft to engage the rod-shaped spring 5 at the end of the lever 11, forcing the rod-shaped spring into the teeth of the spur gear 4 at the end of the shaft 3. The crownwheel 6 is thus coupled with the spur gear 4 in such a manner that when the crownwheel 6 is turned the spur gear 4 together with the shaft 3 and the worm 2 will be turned simultaneously. Through the toothed segment 1 the worm 2 imparts a rotary motion to the rotor shaft 32 and the rotor plates 33 of the variable capacitor 31 thus changing the frequency of the oscillator which determines the watch rate. The cut of the rotor plates 33 is selected so that the frequency change accomplished by the adjustment of the variable capacitor is matched to the frequency characteristic of the electronic watch.

Since the teeth of the crownwheel 6 are incapable of maintaining the rod-shaped spring 5 engaged over more than a comparatively small portion of their rotation, the rod-shaped spring 5 will jump out of the teeth at a predetermined angle of rotation of the crownwheel so that the crownwheel is no longer coupled with the spur gear 4 and the offset end of the rod-shaped spring rests against the smooth circumference of the crownwheel 6. The rod-shaped spring 5 cannot be returned to its initial position by the action of the flexible rod 10 until the setting shaft 8 returns to its position of rest when the milled knob **8*a*** is released.

In order to prevent this adjustment from being repeated after a brief interval, the watch shown in the drawing incorporates a locking device which becomes operative after a single actuation of the setting shaft and which is automatically released after a predetermined length of time. For a certain time, this locking device thus prevents the setting shaft from being coupled again with the members serving to adjust the variable capacitor which determines the watch rate. In the embodiment shown in the drawing by way of example this locking action is achieved by initially preventing the rod-shaped spring 5 from returning into its initial position when the milled knob 8*a* is released. For this purpose, the shaft 12 carrying the two-armed lever 11 with the rod-shaped spring 5 is provided with a leaf spring 13 at the end opposite the lever 11, the leaf spring being normally forced against the rounded head of a threaded bolt 14. The threaded bolt is fastened on a shaft 15, which is driven by the movement of the watch. When the rod-shaped spring 5 together with the two-armed lever 11 is deflected by the actuation of the setting shaft 8, the lever shaft 12 will also be turned by a small angular amount and the leaf spring slips off the head of the threaded bolt 14, moving to the position indicated by the dash lines and entering into a thread of the bolt 14. The fact that the leaf spring 13 is arrested by the threaded bolt 14 prevents the shaft 12 and, consequently, the rod-shaped spring 5 from returning to their initial positions when the setting shaft 8 is released. If the setting shaft is then actuated again, the crownwheel 6 will slip past the rod-shaped spring 5 so that the crownwheel 6 cannot be coupled with the spur gear 4.

The lock is released by the leaf spring 13 in the thread of the bolt 14, which, as explained, is mounted on a shaft driven by the movement 15 being gradually screwed up to the head of the bolt and returning to its initial position on the head of the threaded bolt after a certain length of time which is determined by the speed of rotation of the bolt so that the rod-shaped spring 5 also returns to its initial position.

In the embodiment of the invention shown by way of illustration, the locking device can be arbitrarily put into effect by hand in a very simple manner, if it is not desired to combine an adjustment of the watch rate with a correction of the hand setting. For this purpose a rotatable shaft 19 is provided with an eccentric 20 which deflects the spring 13 from the point of the threaded bolt 14 to the position indicated by the dash lines, i.e. the position in which the locking device is effective, when the shaft 19 is rotated.

In the embodiments of the invention shown in FIGS. 3 and 4 the worm drive 2 used in the embodiment according to FIGS. 1 and 2 is replaced by a cam 22 to effect the adjustment of the frequency-determining component. In this embodiment, the frequency-determining adjustable component takes the form of a potentiometer 36, which may be located in the base circuit of the input transistor of a multivibrator circuit or in the emitter-collector circuit of the transistor of an LC generator, for example. The potentiometer shaft 37, which supports the slider 38 of the potentiometer, mounts an arm 39 with friction fit, said arm bearing against the circumference of the cam 22 with a pin 21 provided at its end and being permanently applied against said cam by a spring 27.

The shaft 28, which carries the cam 22, also mounts a gear 23 engaging a spur gear 24 which in turn is mounted on a shaft 25 carrying a crownwheel 26 which performs the same function as the spur gear 4 in the device according to FIGS. 1 and 2. When the setting shaft 8 is pulled out, said crownwheel 26 is coupled with the crownwheel 6 on the setting shaft by means of a rod-shaped spring 5 and thus adjusted.

During initial adjustment of the watch rate the slider 38 of the potentiometer can be moved to the position in which the frequency of the oscillator has the desired value by inserting a screw driver into a slot 40 of the potentiometer shaft 37. The arm 39 is then rotated on the potentiometer shaft 37 until its pin 21 contacts the cam.

In a modified form of this embodiment of the invention the intermediate gears 23, 24 may be omitted, the cam being mounted directly on the shaft 25 with the crownwheel 26. However, the adjustment obtained by this arrangement is less precise.

Furthermore, matching the potentiometer to the frequency characteristic of the oscillator may be achieved by means of a non-linear resistance instead of a cam. As indicated in FIG. 5, the adjustable component may take the form of a wire-wound potentiometer 41 with a non-uniform winding 42 so that a rotary motion of the slider 43 produces a non-linear change of resistance as a function of the angular displacement. In this case the slider 43 may have an arm with a toothed segment similar to that of the embodiment according to FIGS. 1 and 2, said toothed segment engaging the worm 2 of the embodiment according to FIGS. 1 and 2.

Naturally, the adjustable component for correcting the watch rate may take the form of a variable inductance, such as a coil with a slidable magnetic core, instead of a variable resistance or a variable capacitor. Since aging of the circuit elements is a comparatively slow process, frequent adjustments of the watch to compensate the rate changes caused by such aging can be dispensed with. It is, therefore, advisable to ensure that the coupling lock remains operative for several days. This may be achieved, for instance, by driving the shaft 15 according to FIG. 1, which carries the threaded bolt 14, at extremely slow speeds.

It shall be understood that the present invention is not restricted to the embodiments shown by way of example and that deviations from said embodiments are possible without exceeding the scope of this invention. Numerous possibilities of transferring the motion of the setting mechanism to the correcting member are available to those skilled in the art. In addition, the adjustment of the correcting member might be derived directly from the minute shaft.

I claim:

1. A watch with a purely electronic oscillator for generating periodic signals to drive the time indicator, characterized in that a frequency determining component of the oscillator is adjustable in size and coupled with a setting mechanism means for correcting the hand setting in such a manner that the size of said frequency-determining component is changed when the hands are adjusted so that the timing accuracy is improved when the hand setting is adjusted.

2. A watch as claimed in claim 1, characterized in that the coupling between the setting mechanism means and the adjustable frequency-determining component of the oscillator is effective only within a small angular portion of the range of adjustment of the setting mechanism means.

3. A watch as claimed in claim 1, characterized in that a locking device is provided which becomes effective when the effective range of the coupling is exceeded during initial setting and which keeps the setting mechanism disengaged from the adjustable component during a predetermined length of time.

4. A watch as claimed in 3, characterized in that the locking device can be put into operation arbitrarily.

5. A watch as claimed in claim 1, characterized in that the setting mechanism means and the adjustable frequency-determining component are coupled by a transmission with a variable transmission ratio for matching the change of the adjustable frequency-determining component with the frequency characteristic of the oscillator.

6. A watch as claimed in claim 1, characterized in that the adjustable frequency-determining component has a non-linear characteristic matched to the frequency characteristic of the osillator.

7. A watch as claimed in claim 1, characterized in that the adjustable frequency-determining component is a potentiometer.

8. A watch as claimed in claim 1, characterized in that the adjustment of the frequency-determining component is derived from the minute shaft.

9. A watch as claimed in claim 2, characterized in that a locking device is provided which becomes effective when the effective range of the coupling is exceeded during initial setting and which keeps the setting mechanism means disengaged from the adjustable frequency-determining component during a predetermined length of time.

10. A watch as claimed in claim 9, characterized in that the locking device can be put into operation arbitrarily.

11. A watch as claimed in claim 5, characterized in that the coupling between the setting mechanism means and the adjustable frequency-determining component of the oscillator is effective only within a small angular portion of the range of adjustment of the setting mechanism means.

12. A watch as claimed in claim 11, characterized in that a locking device is provided which becomes effective when the effective range of the coupling is exceeded during initial setting and which keeps the setting mechanism means disengaged from the adjustable frequency-determining component during a predetermined length of time, wherein the locking device can be put into operation arbitrarily.

13. A watch as claimed in claim 6, characterized in that the coupling between the setting mechanism means and the adjustable frequency-determining component of the oscillator is effective only within a small angular portion of the range of adjustment of the setting mechanism means.

14. A watch as claimed in claim 6, characterized in that a locking device is provided which becomes effective when the effective range of the coupling is exceeded during initial setting and which keeps the setting mechanism means disengaged from the adjustable frequency-determining component during a predetermined length of time, wherein the locking device can be put into operation arbitrarily.

15. A watch as claimed in claim 1, characterized in that the adjustable frequency-determining component is a variable capacitor.

16. A watch as claimed in claim 1, characterized in that the adjustable frequency-determining component is an inductance with an adjustable iron core.

17. A watch as claimed in claim 1, characterized in that the adjustable frequency-determining component is an inductance with an adjustable coupling.

18. A watch as claimed in claim 8, characterized in that the coupling between the setting mechanism means and the adjustable frequency-determining component of the oscillator is effective only within a small angular portion of the range of the adjustment of the setting mechanism means.

19. A watch as claimed in claim 8, characterized in that a locking device is provided which becomes effective when the effective range of the coupling is exceeded during initial setting and which keeps the setting mechanism means disengaged from the adjustable frequency-determining component during a predetermined length of time, wherein the locking device can be put into operation arbitrarily.

20. A watch as claimed in claim 18, characterized in that the setting mechanism means and the adjustable frequency-determining component are coupled by a transmission means with a variable transmission ratio for matching the change of the adjustable frequency-determining component with the frequency characteristic of the oscillator.

21. A watch as claimed in claim 20, characterized in that the transmission means includes a cam.

22. A watch as claimed in claim 20, characterized in that the adjustable frequency-determining component has a non-linear characteristic matched to the frequency characteristic of the oscillator.

23. A watch as claimed in claim 22, characterized in that the adjustable frequency-determining component is a variable capacitor.

References Cited

UNITED STATES PATENTS 3,287,896 11/1966 Kolodziej ----------- 58—85.5

RICHARD B. WILKINSON, Primary Examiner

E. C. SIMMONS, Assistant Examiner

U.S. Cl. X.R.

58—85.5